United States Patent
Park et al.

(10) Patent No.: US 10,692,585 B2
(45) Date of Patent: Jun. 23, 2020

(54) MEMORY SYSTEM FOR ERROR TEST

(71) Applicant: SK hynix Inc., Gyeonggi-do (KR)

(72) Inventors: Sung Jin Park, Gyeonggi-do (KR); Jong Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 16/025,309

(22) Filed: Jul. 2, 2018

(65) Prior Publication Data

US 2019/0164625 A1    May 30, 2019

(30) Foreign Application Priority Data

Nov. 24, 2017  (KR) ........................ 10-2017-0158608

(51) Int. Cl.
*G11C 29/00* (2006.01)
*G11C 29/44* (2006.01)
*G11C 29/38* (2006.01)
*G11C 29/12* (2006.01)
*G11C 29/36* (2006.01)
*G11C 29/46* (2006.01)
*G11C 29/42* (2006.01)

(52) U.S. Cl.
CPC .......... *G11C 29/44* (2013.01); *G11C 29/1201* (2013.01); *G11C 29/38* (2013.01); *G11C 29/42* (2013.01); *G11C 29/46* (2013.01); *G11C 2029/3602* (2013.01); *G11C 2029/4402* (2013.01)

(58) Field of Classification Search
CPC ..... G11C 29/44; G11C 29/1201; G11C 29/38; G11C 29/42; G11C 29/46
See application file for complete search history.

(56) References Cited

U.S. PATENT DOCUMENTS

| | | | | |
|---|---|---|---|---|
| 7,039,124 B2* | 5/2006 | Lee | ...................... | H03F 1/3241 330/11 |
| 8,347,308 B2* | 1/2013 | Kawakami | ............ | G06Q 10/06 718/106 |
| 8,499,198 B1* | 7/2013 | Messenger | .......... | G06F 11/2273 714/42 |
| 8,621,292 B2* | 12/2013 | Kim | ................. | G11C 29/56004 714/718 |
| 9,009,531 B2* | 4/2015 | Mozak | ................... | G11C 29/02 714/32 |
| 9,235,488 B2* | 1/2016 | Norrie | ................. | G06F 11/2215 |
| 9,632,894 B2* | 4/2017 | Han | ..................... | G06F 11/2215 |

(Continued)

FOREIGN PATENT DOCUMENTS

| | | |
|---|---|---|
| KR | 1020050070990 | 7/2005 |
| KR | 100825786 | 4/2008 |

*Primary Examiner* — Esaw T Abraham
(74) *Attorney, Agent, or Firm* — IP & T GROUP LLP (57) ABSTRACT

A memory system includes: a memory controller configured to control communication between a host and a memory device; and an error test device configured to store error operation codes for generating errors, wherein the error test device outputs the error operation codes to the memory controller under the control of the memory controller, and wherein the memory controller determines whether an error has been generated in any operation corresponding to any of the error operation codes, and, when it is determined that an error has been generated, the memory controller stores one or more error requests corresponding to the generated error.

9 Claims, 7 Drawing Sheets

(56) References Cited

U.S. PATENT DOCUMENTS

| | | | | |
|---|---|---|---|---|
| 9,805,827 | B2* | 10/2017 | Son | G11C 29/4401 |
| 2012/0131399 | A1* | 5/2012 | Henrion | G11C 7/1069 |
| | | | | 714/723 |
| 2014/0164833 | A1* | 6/2014 | Kobla | G06F 11/27 |
| | | | | 714/30 |
| 2014/0189433 | A1* | 7/2014 | Schoenborn | G11C 29/06 |
| | | | | 714/42 |
| 2017/0117061 | A1* | 4/2017 | Sharon | G11C 29/06 |
| 2017/0123881 | A1* | 5/2017 | Seo | G06F 11/1417 |

\* cited by examiner

MEMORY SYSTEM FOR ERROR TEST

CROSS-REFERENCE TO RELATED APPLICATION

The present application claims priority under 35 U.S.C. § 119(a) to Korean patent application number 10-2017-0158608, filed on Nov. 24, 2017, which is incorporated herein by reference in its entirety.

BACKGROUND

1. Field of Invention

Various embodiments of the present disclosure generally relate to a memory system. Particularly, the embodiments relate to a memory system capable of efficiently managing an error test.

2. Description of Related Art

A memory system may include a memory device and a memory controller.

The memory device may store data or output the stored data. The memory device may be configured as a volatile memory device in which stored data is lost when power supply is interrupted, or be configured as a nonvolatile memory device in which stored data is retained when power supply is interrupted.

The memory controller may control data communication between a host and a storage device.

The host may communicate with the memory device through the memory controller by using an interface protocol such as peripheral component interconnect-express (PCI-E), advanced technology attachment (ATA), serial ATA (SATA), parallel ATA (DATA), or serial attached SCSI (SAS). Interface protocols between the host and the memory system are not limited to the above-described examples. Other interface protocols such as a universal serial bus (USB), a multi-media card (MMC), an enhanced small disk interface (ESDI), and integrated drive electronics (IDE) may also be used.

SUMMARY

Embodiments provide a memory system that includes an error test device capable of performing an error test and managing various errors.

According to an aspect of the present disclosure, there is provided a memory system including: a memory controller configured to control communication between a host and a memory device; and an error test device configured to store error operation codes for generating errors, wherein the error test device outputs the error operation codes to the memory controller under the control of the memory controller, and wherein the memory controller determines whether an error has been generated in any operation corresponding to any of the error operation codes, and, when it is determined that an error has been generated, the memory controller stores one or more error requests corresponding to the generated error.

According to an aspect of the present disclosure, there is provided a memory system including: an error test device storing error operation codes for generating errors and error data; a ROM including test firm are code; a central processing unit (CPU) configured to execute the error operation codes or firmware using the error operation codes in response to the test firmware code, and determine whether an error has been generated; and an internal memory configured to store one or more error requests for any operation in which the error is generated, when the error is generated.

According to an aspect of the present disclosure, there is provided a memory system including: a memory device; an error test device configured to perform an error test operation in response to a first request; and a controller configured to determine whether the first request is an error-corresponding request when an error is detected during the error test operation for the first request, and report an error corresponding to a second request without performing any operation for the second request when the second request is determined by the controller to be the error-corresponding request, wherein, during the error test operation, the error test device executes an error operation code configured to intentionally cause an error or controls the memory device to perform an operation with error data including an intentional error.

BRIEF DESCRIPTION OF THE DRAWINGS

Various embodiments will now be described in more detail hereinafter with reference to the accompanying drawings; however, elements and features may be embodied in different forms and should not be construed as limited to the embodiments set forth herein. Rather, these embodiments are provided so that this disclosure is thorough and complete and fully conveys the scope of the embodiments to those skilled in the art. In the description below, reference to "an embodiment" is not necessarily to only one embodiment, and different references to "an embodiment" are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, embodiments of the present disclosure are shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include one or more other components unless the context indicates otherwise.

The terminology used herein is for the purpose of describing particular embodiments only and is not intended to be limiting of the present invention.

As used herein, singular forms may include the plural forms as well and vice versa, unless the context clearly indicates otherwise.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

Figure 1:
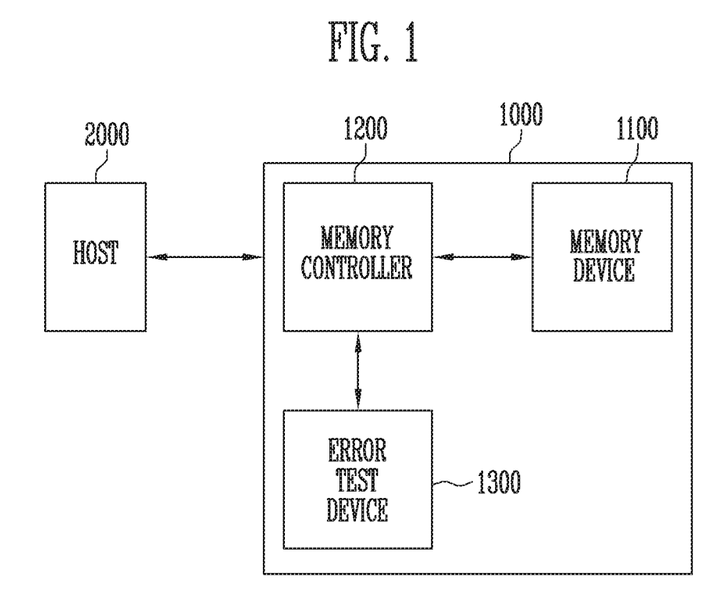
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a memory device 1100 for storing data, a memory controller 1200 for controlling the memory device 1100 in response to a request of a host 2000 and transmitting data received from the memory device 1100 to the host 2000, and an error test device 1300 for performing a test operation of the memory system by intentionally generating an error for the test operation.

The memory device 1100 may include a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR), a Rambus Dynamic Random Access Memory (RDRAM), or a flash memory, which operates under the control of the memory controller 1200.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). The interface protocols between the host 2000 and the memory system 1000 are not limited to the above-described examples. Other interface protocols such as a Universal Serial Bus (USB), a Multi-Media Card (MMC), an Enhanced Small Disk Interface (ESDI), and Integrated Drive Electronics (IDE) may also be used.

The memory controller 1200 may control overall operations of the memory system 1000 and control data exchange between the host 2000 and the memory device 1100. For example, the memory controller 1200 may translate received information such that a command, an address, and data can be communicated between the host 2000 and the memory device 1100, and store and output the translated information. For example, the memory controller 1200 may control the memory device to perform a program, read, or erase operation. In addition, if an error is generated in the memory system 1000 due to sudden power-off, and the like, the memory controller 1200 may perform a rebuild operation, based on debugging information.

The error test device 1300 may perform a test operation to determine whether an error exists in the memory system 1000. The error test device 1300 may be configured with hardware, and may be provided separately from the memory controller 1200. For example, the error test device 1300 may store operation codes for performing operations in response to virtual requests transmitted from the host 2000 to the memory controller 1200. Alternatively, the error test device 1300 may store data in which intentionally generated or caused errors are included. Alternatively, the error test device 1300 may store data in which various operation codes and such errors are included.

The memory controller 1200 may store a request for generating an error during an error test operation by the error test device 1300. If a normal request is received from the host 2000, the memory controller 1200 may determine whether the received normal request is a request by which an error is generated. When the normal request is determined to be an error-corresponding request, the memory controller 1200 may output an error signal to the host 2000. Here, the normal request is not a request requiring a test operation but a request for a normal operation.

Figure 2:
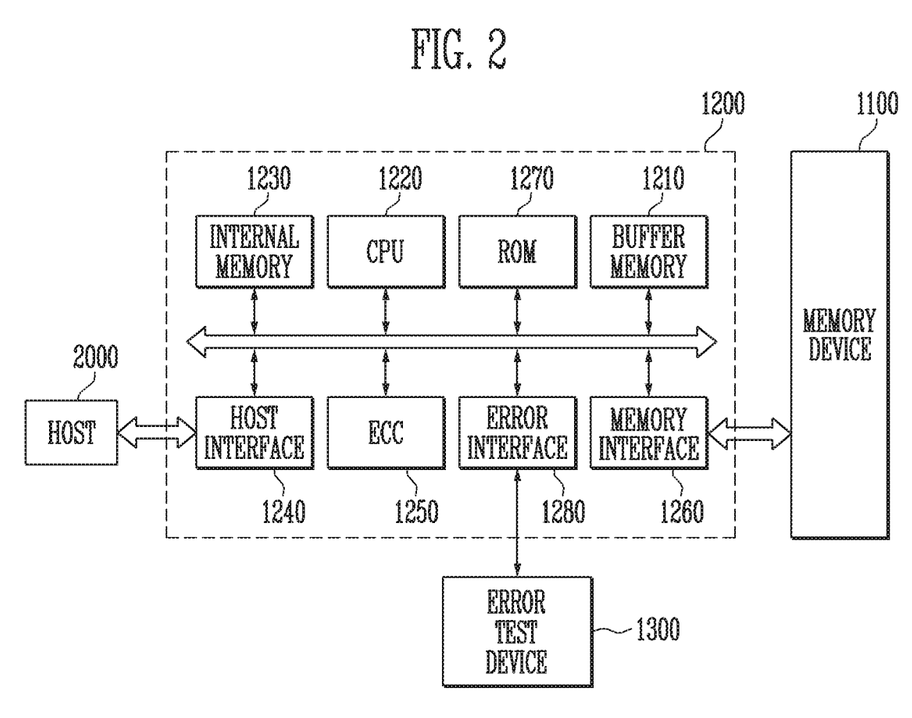
FIG. 2 is a diagram illustrating in detail a memory controller of FIG. 1.

FIG. 2 is a diagram illustrating in detail the memory controller 1200 of FIG. 1.

Referring to FIG. 2, the memory controller 1200 may control communication between the host 2000 and the memory device 1100, and perform an error test operation received from the error test device 1300.

The memory controller 1200 may include a buffer memory 1210, a central processing unit (CPU) 1220, an internal memory 1230, a host interface 1240, an ECC 1250, a memory interface 1260, a ROM 1270, and an error interface 1280.

The buffer memory 1210 may temporarily store data communicated between the memory controller 1200 and the memory device 1100. For example, in a program operation, data to be programmed may be temporarily stored in the buffer memory 1210 before the data is transmitted to the memory device 1100. At this time, the stored data may be re-used when the program operation fails in the memory device 1100. Also, in a read operation, data read from the memory device 1100 may be temporarily stored in the buffer memory 1210. For example, if read data having a fixed capacity is temporarily stored in the buffer memory 1210 in the read operation, the read data may be output to the host 2000 through the host interface 1240.

The CPU 1220 may perform various calculations for controlling the memory device 1100. The CPU 1220 may generate a command or perform firmware. Also, the CPU 1220 may perform a test operation according to operation codes for an error test, which are received from the error test device 1300, and analyze the pattern of error-included data based on the data for the error test provided by the error test device 1300.

The internal memory 1230 may be used as a storage device capable of storing various system information required to perform an operation of the memory controller 1200. For example, the internal memory 1230 may be implemented with an SRAM. The internal memory 1230 may include a table in which various system information required to perform an operation of the memory system 1000 are stored. In addition, information on error-corresponding requests for the error test operation may be stored in the internal memory 1230. That is, information on the error-corresponding requests may be stored in the internal memory 1230. If a normal request is received from the host 2000, the CPU 1220 may compare the received normal request with the error-corresponding requests stored in the internal memory 1230. When the normal request corresponds to any one of the error-corresponding requests stored in the internal memory 1230, the CPU 1220 may output an error signal to the host 2000.

The host interface 1240 may communicate with the external host 2000 coupled to the memory system 1000 under the control of the CPU 1220. For example, the host interface 1240 may receive a write command, a test command, a logical address, and data from the host 2000. Also, the host interface 1240 may receive a read command and a logical address corresponding to the read command from the host 2000.

The ECC 1250 is an error correction component, and may detect or correct an error included in data read from the memory device 1100. For example, the ECC 1250 may perform an ECC encoding operation, based on data to be written in the memory device 1100 through the memory interface 1260. The data on which the ECC encoding operation is performed may be transferred to the memory device 1100 through the memory interface 1260. Also, the ECC 12250 may perform ECC decoding on data received from the memory device 1100 through the memory interface 1260. The ECC 1250 may perform an ECC operation, based on Bose, Chaudhuri, and Hocquenghem (BCH) code or Low Density Parity Check (LDPC) code. However, the ECC 1250 is not limited to these error correction techniques. Accordingly, the ECC 1250 may include circuits, modules, systems, or devices for error correction.

Also, the ECC 1250 may perform ECC encoding or ECC decoding, based on data to be written in the buffer memory 1210.

The memory interface 1260 may communicate with the memory device 1100 under the control of the CPU 1220. The memory interface 1260 may communicate a command, an address, and data with the memory device 1100 through a channel.

The ROM 1270 is a read only memory, and may include a nonvolatile memory device in which information is retained even when power supply is stopped. For example, a plurality of ROM codes may be stored in the ROM 1270. The codes may be configured for executing with firmware.

In an error test operation of the memory system 1000, the error interface 1280 may be configured to communicate with the error test device 1300 under the control of the CPU 1220.

Figure 3:
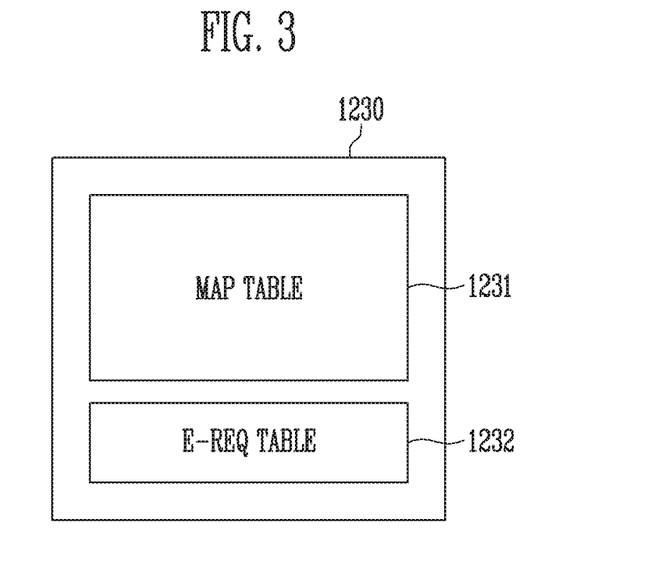
FIG. 3 is a diagram illustrating in detail an internal memory of FIG. 2.

FIG. 3 is a diagram illustrating in detail the internal memory 1230 of FIG. 2.

Referring to FIG. 3, the internal memory 1230 may be used as a storage device capable of storing various system information required to perform an operation of the memory controller 1200. For example, the internal memory 1230 may include a map table (MAP TABLE) 1231 and an error request table (E-REQ TABLE) 1232. Mapping information between a logical address and a physical address may be stored in the map table 1231. Information on the error-corresponding requests for an error test operation may be stored in the error request table (E-REQ TABLE) 1232.

Figure 4:
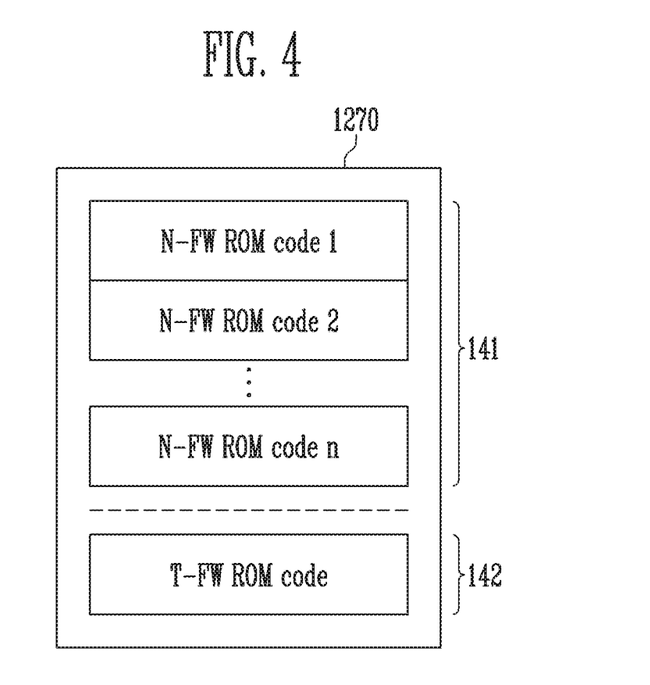
FIG. 4 is a diagram illustrating in detail a ROM of FIG. 2.

FIG. 4 is a diagram illustrating in detail the ROM 1270 of FIG. 2.

Referring to FIG. 4, the ROM 1270 may include a normal firmware code storage 141 and a test firmware code storage 142.

A plurality of normal firmware ROM codes (N-FW ROM code 1 to N-FW ROM code n, where n is a positive integer) for performing normal firmware operations, but excluding a test operation, may be stored in the normal firmware code storage 141. At least one test firmware ROM code T-FW ROM code for performing the test operation may be stored in the test firmware code storage 142.

Figure 5:
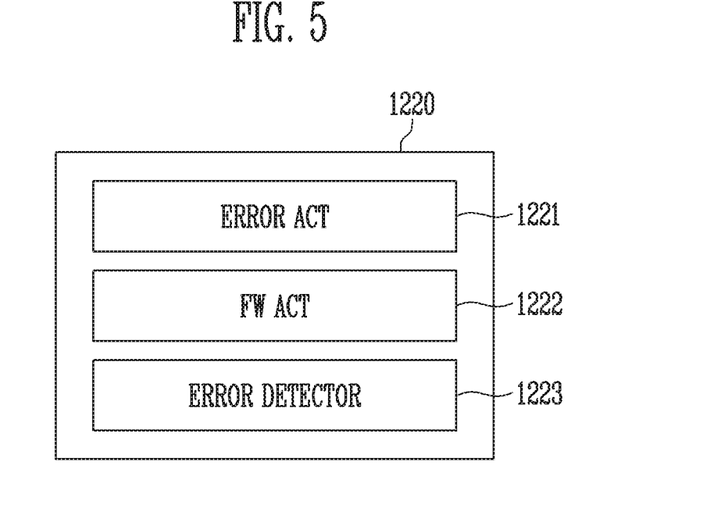
FIG. 5 is a diagram illustrating in detail a CPU of FIG. 2.

FIG. 5 is a diagram illustrating in detail the CPU 1220 of FIG. 2.

Referring to FIG. 5, the CPU 1220 may include an error operation determiner (ERROR ACT) 1221, a firmware determiner (FW ACT) 1222, and an error detector (ERROR DETECTOR) 1223.

The error operation determiner 1221 may determine whether a test operation has been successfully performed without any error. Information on whether the test operation has been successfully performed may be transmitted to the error detector 1223.

The firmware determiner 1222 may determine whether test firmware has been successfully executed according to a test firmware ROM code (T-FW ROM code), which is output from the ROM 1270. Information on whether the firmware has been successfully executed may be transmitted to the error detector 1223.

The error detector 1223 may determine whether an error has been generated in the test operation or execution of the test firmware, based on the information received from the error operation determiner 1221 or the firmware determiner 1222. If it is determined that an error has been generated, the error detector 1223 may write an error-corresponding request corresponding to the error that occurred during the test operation, in the error request table 1232 in the internal memory 1230.

Figure 6:
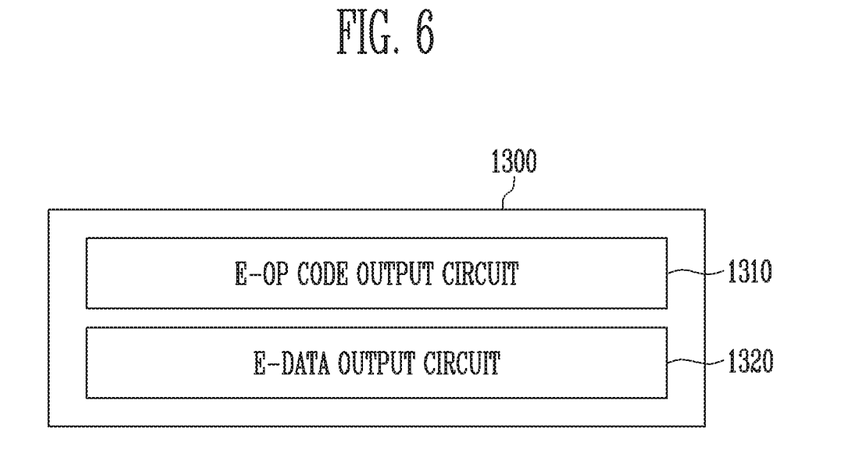
FIG. 6 is a diagram illustrating in detail an error test device of FIG. 2.

FIG. 6 is a diagram illustrating in detail the error test device 1300 of FIG. 2.

Referring to FIG. 6, the error test device 1300 may include an error operation code output circuit (E-OP CODE OUTPUT CIRCUIT) 1310 and an error data output circuit (E-DATA OUTPUT CIRCUIT) 1320. Various error operation codes for intentionally causing an error may be stored in the error operation code output circuit 1310. The operation codes may be generated based on a result obtained by performing test operations of the memory system multiple times. Data including various patterns of how an error is generated may be stored in the error data output circuit 1320.

If the error test device 1300 is activated by the CPU 1220, error operation codes stored in the error operation code output circuit 1310 or error data stored in the error data output circuit 1320 may be output. For example, the error operation code output circuit 1310 may sequentially output the stored error operation codes. The error operation code output circuit 1310 may selectively output the error operation codes under the control of the CPU 1220. The error operation code output circuit 1310 may randomly output the error operation codes. The error data output circuit 1320 may sequentially output the stored error data. The error data output circuit 1320 may selectively output the error data under the control of the CPU 1220. The error data output circuit 1320 may randomly output the error data. The memory controller 1200 may perform the test operation with the error data provided from the error data output circuit 1320. For example, the test operation may be a write operation of storing the error data into the memory device 1100 or a read operation of reading out the error data from the memory device 1100 and detecting an error in the error data.

As described above, the memory controller 1200 may execute the error operation code provided from the error operation code output circuit 1310, or may perform the test operation with the error data provided from the error data output circuit 1320, so that it is possible to test whether the memory system 1000 is to successfully detect an error. Further, various cases casing an error can be tested by the test operation. In addition, if information on a request corresponding to an error, which occurs during the test operation is stored in the memory controller 1200, when a normal (non-error-corresponding) request is received from the host 2000, it is possible to determine in advance whether an error is to occur before an operation is performed in response to the received normal request.

Figure 7:
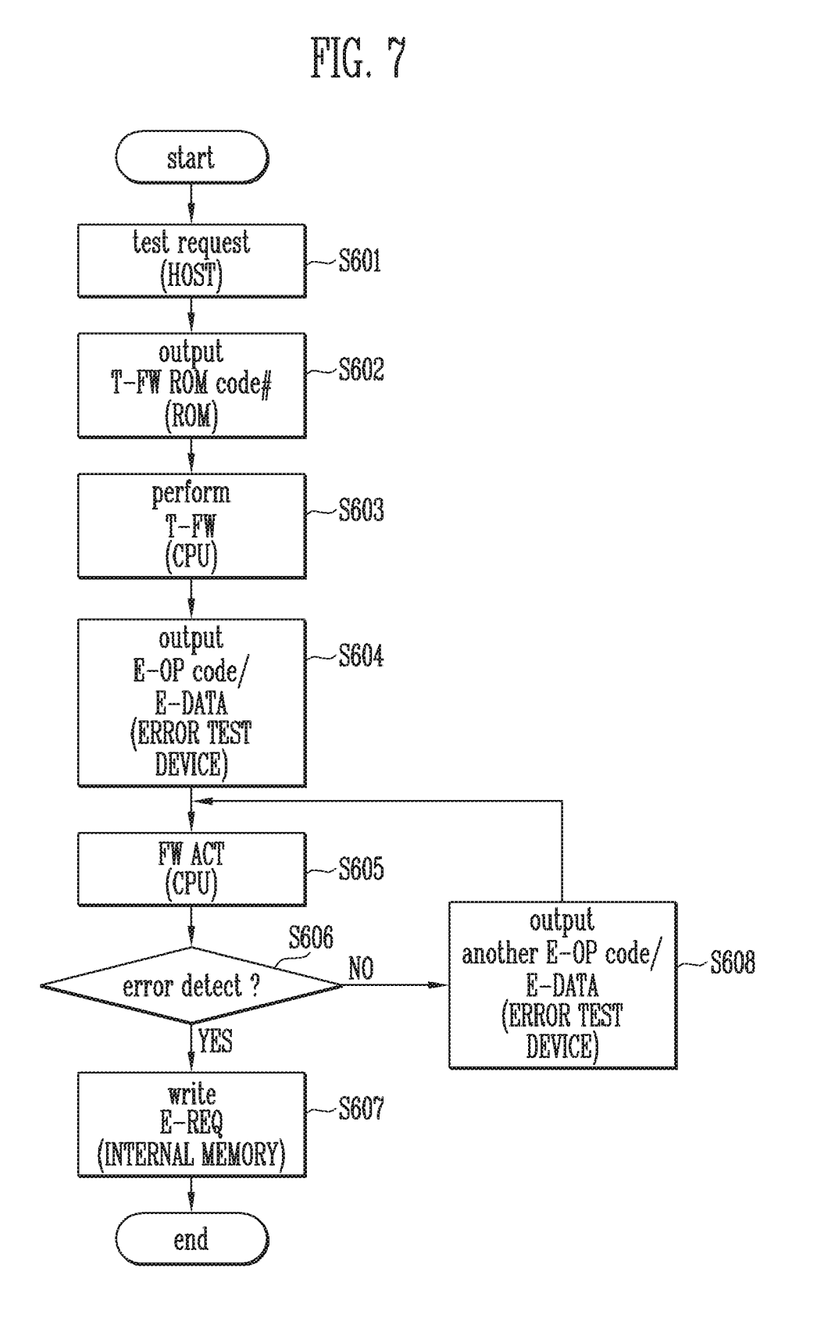
FIG. 7 is a flowchart describing an error test method according to an embodiment of the present disclosure.

FIG. 7 is a flowchart describing an error test method according to an embodiment of the present disclosure.

Referring to FIG. 7, along with other figures for components and features, the host 2000 may transmit a test request to the memory controller 1200 so as to perform an error test operation at step S601.

The memory controller 1200 may select a test firmware ROM code (T-FW ROM code #) for driving firmware related to the error test operation from the ROM 1270 in response to the test request at step S602.

The CPU 1220 may drive test firmware according to the test firmware ROM code (T-FW ROM code #) at step S603.

If the test firmware is driven, the error test device 1300 may output an error operation code (E-OP code) or error data (E-DATA) at step S604.

The firmware determiner 1222 may determine whether firmware driven using the error operation code (E-OP code) has been successfully performed or an error of the error data (E-DATA) has been successfully detected at step S605. The firmware determiner 1222 may transmit the determined result to the error detector 1223.

The error detector 1223 may determine whether an error has been generated in the test operation based on information received from the firmware determiner 1222 at step S606.

If it is determined that an error has been generated ('YES' at step S606), the error detector 1223 may store a request corresponding to an error, which occurs during the test operation, in the error request table 1232 of the internal memory 1230 at step S607.

Alternatively, if it is determined that no error has been detected ('NO' at step S606), the error detector 1223 may output a signal indicating that no error has been detected by the error test device 1300, and the error test device 1300 may output another error operation code (E-OP code) or another error data (E-DATA) in response to the corresponding signal provided from the error detector 1223 at step S608.

Subsequently, the steps S605 to S608 may be repeated until all of the error operation code (E-OP code) and the error data (E-DATA), which is stored in the error test device 1300, are used. Alternatively, the steps S605 to S608 may be repeated until selected codes or data among the error operation code (E-OP code) or the error data (E-DATA), which is stored in the error test device 1300, are used.

Figure 8:
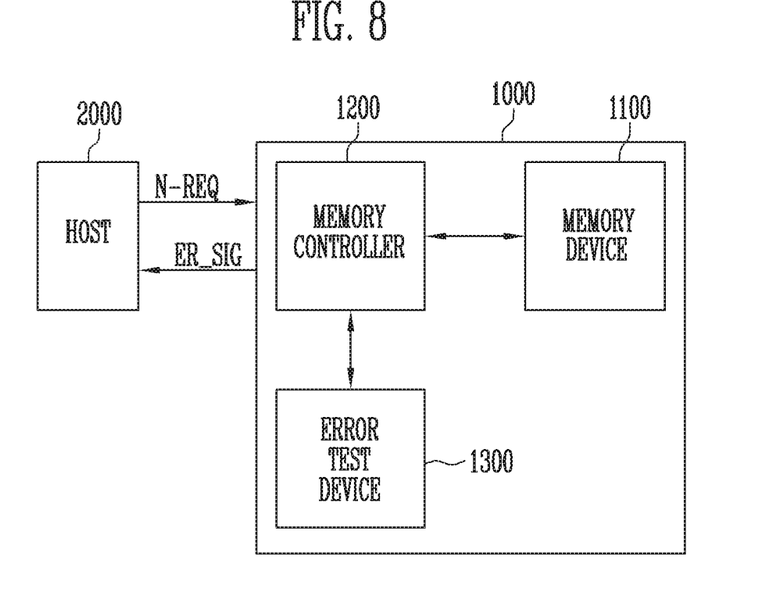
FIG. 8 is a diagram illustrating an operation between the memory system and a host according to an embodiment of the present disclosure.

FIG. 8 is a diagram illustrating an operation between the memory system 1000 and the host 2000 according to an embodiment of the present disclosure.

Referring to FIG. 8, after the above-described error test operation is ended, and the requests corresponding to an error, which occurs during the test operation, are stored, the host 2000 may transmit a normal request (N-REQ) to the memory system 1000. Before a command or the like for a normal operation is transmitted to the memory device 1100 in response to the normal request (N-REQ), the memory controller 1200 may compare the normal request (N-REQ) with the error-corresponding requests stored in the internal memory 1230 (of FIG. 2). As a comparison result, if there is an error-corresponding request corresponding to the received normal request (N-REQ), the memory controller 1200 may generate an error signal (ER_SIG) and output such signal to the host 2000. Therefore, the host 2000 may process the normal request (N-REQ) corresponding to the error signal (ER_SIG) as a bad request. If there is no error-corresponding request corresponding to the received normal request (N-REQ), the memory controller 1200 may control the memory device 1100 to perform an operation in response to the received normal request (N-REQ).

Figure 9:
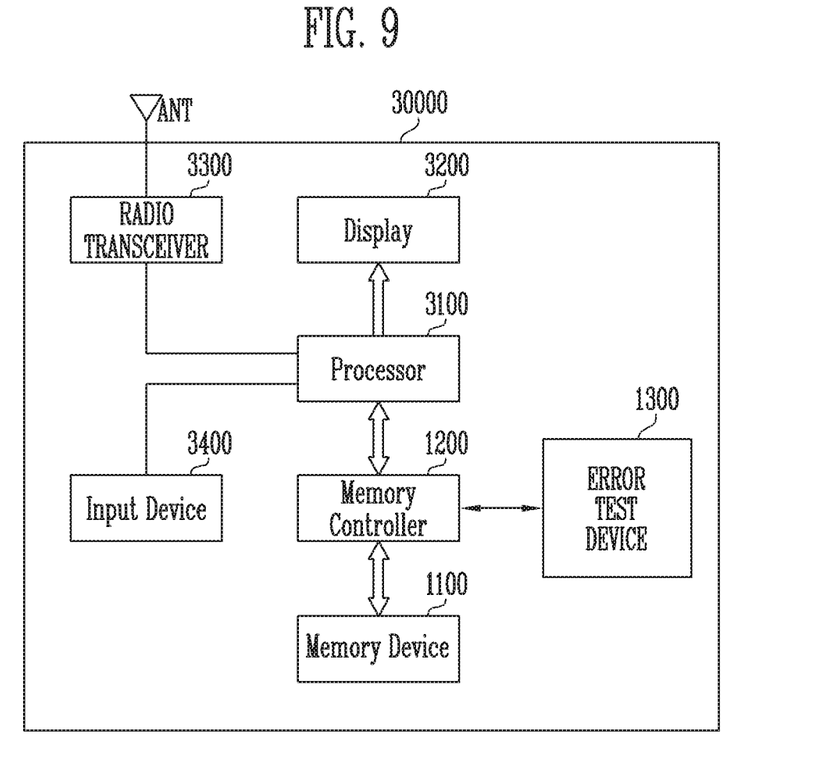
FIGS. 9 to 12 are diagrams illustrating various application examples of the memory system including the memory controller shown in FIG. 2.

FIG. 9 is a diagram illustrating an application example of the memory system including the memory controller shown in FIG. 2. For example, a memory system 30000 may correspond to the memory system 1000 of FIG. 1.

Referring to FIG. 9, the memory system 30000 may be implemented as a cellular phone, a smart phone, a tablet PC, a personal digital assistant (PDA), or a wireless communication device. The memory system 30000 may include a memory device 1100, a memory controller 1200 capable of controlling an operation of the memory device 1100, and an error test device 1300 capable of performing an error test operation. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the semiconductor memory device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or may be implemented as a chip separate from the processor 3100.

Figure 10:
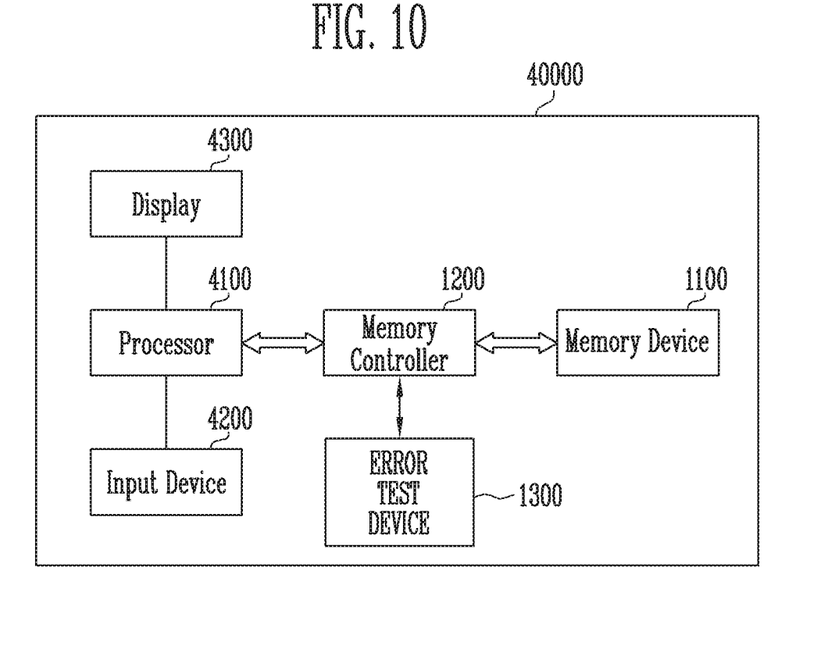

FIG. 10 is a diagram illustrating an application example of the memory system including the memory controller shown in FIG. 2. For example, a memory system 40000 may correspond to the memory system 1000 of FIG. 1.

Referring to FIG. 10, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100, a memory controller 1200 capable of controlling a data processing operation of the memory device 1100, and an error test device 1300 capable of performing an error test operation.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or may be implemented as a chip separate from the processor 4100.

Figure 11:
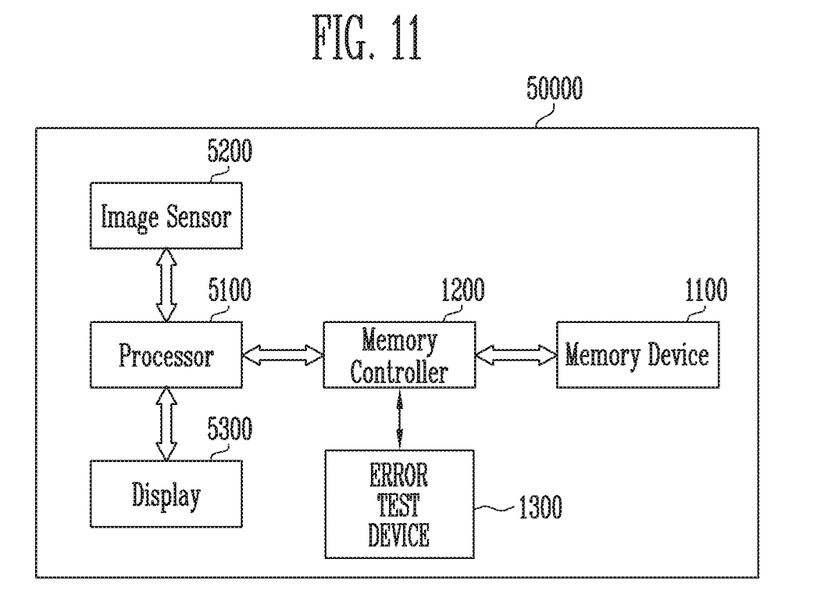

FIG. 11 is a diagram illustrating an application example of the memory system including the memory controller shown in FIG. 2. For example, a memory system 50000 may correspond to the memory system 1000 of FIG. 1.

Referring to FIG. 11, the memory system 50000 may be implemented as an image processing device, e.g., a digital camera, or a device that includes, or has attached to it, a digital camera such as a mobile terminal, a smart phone, or a tablet PC.

The memory system 50000 may include a memory device 1100, a memory controller 1200 capable of controlling a data processing operation of the memory device 1100, e.g., a program operation, an erase operation, or a read operation, and an error test device 1300 capable of performing an error test operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or may be implemented as a chip separate from the processor 5100.

Figure 12:
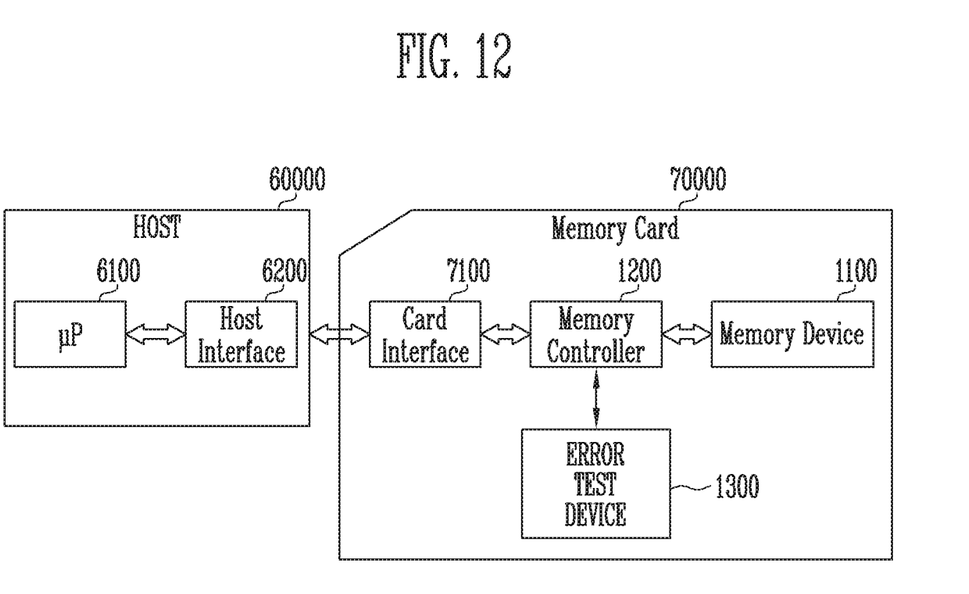

FIG. 12 is a diagram illustrating an application example of the memory system including the memory controller shown in FIG. 2. For example, a memory system 70000 may correspond to the memory system 1000 of FIG. 1.

Referring to FIG. 12, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a Secure Digital (SD) card interface or a Multi-Media Card (MMC) interface, but the present disclosure is not limited thereto.

The card interface 7100 may interface data exchange between a host 60000 and the memory controller 1200 according to a protocol of the host 60000. In some embodiments, the card interface 7100 may support a Universal Serial Bus (USB) protocol and/or an Inter-Chip (IC)-USB protocol. Here, the card interface 7100 may embody hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor (µP) 6100.

According to embodiments of the present disclosure, as various errors are tested and managed, a request by which an error is generated, among requests received from the host, can be quickly determined, and an error signal for the corresponding request can be quickly output.

Various embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
    a memory controller configured to control communication between a host and a memory device; and
    an error test device configured to store error operation codes which are generated on a result obtained by performing test operations of the memory system,
    wherein the error test device outputs the error operation codes to the memory controller under the control of the memory controller, and
    wherein the memory controller tests the memory device by transferring the error operation codes to the memory device, determines whether an error has been generated in any operation corresponding to any of the error operation codes, and, when it is determined that an error has been generated, the memory controller stores one or more error requests corresponding to the generated error.

2. The memory system of claim 1, wherein the error test device includes an error operation code output circuit in which the error operation codes are stored.

3. The memory system of claim 2, wherein the error operation code output circuit sequentially outputs the error operation codes under the control of the memory controller, or randomly outputs the error operation codes.

4. The memory system of claim 1,
    wherein the memory controller includes an error request table in which the one or more error requests are stored, and
    wherein, when a normal request is received from the host, the memory controller compares the normal request to the one or more error requests stored in the error request table.

5. The memory system of claim 4, wherein the memory controller compares the normal request to the one or more error requests before an operation for the normal request is performed.

6. The memory system of claim 4, wherein, when it is determined that the normal request corresponds to any of the one or more of the error requests, the memory controller generates an error signal and outputs the error signal to the host.

7. The memory system of claim 1, wherein the error test device further includes an error data output circuit in which error data including patterns showing how an error is generated are stored.

8. The memory system of claim 7, wherein the error data output circuit sequentially outputs the error data under the control of the memory controller, or selectively or randomly outputs the error data.

9. A memory system comprising:
   a memory device;
   an error test device configured to generate an error operation code for performing an error operation of the memory device in response to a first request; and
   a controller configured to test the memory device according to the error operation, determine whether the first request is an error-corresponding request when an error is detected during the error operation for the first request, and report an error corresponding to a second request without performing any operation for the second request when the second request is determined by the controller to be the error-corresponding request.

\* \* \* \* \*